United States Patent [19]
Ilderem et al.

[11] Patent Number: 5,675,166
[45] Date of Patent: Oct. 7, 1997

[54] FET WITH STABLE THRESHOLD VOLTAGE AND METHOD OF MANUFACTURING THE SAME

[75] Inventors: Vida Ilderem; Michael H. Kaneshiro, both of Phoenix; Diann Dow, Chandler, all of Ariz.

[73] Assignee: Motorola, Inc., Schaumberg, Ill.

[21] Appl. No.: 499,624

[22] Filed: Jul. 7, 1995

[51] Int. Cl.⁶ .......................... H01L 29/76; H01L 29/94
[52] U.S. Cl. ............................... 257/345; 257/409
[58] Field of Search ............................ 257/335, 345, 257/402, 408, 409, 355; 437/44

[56] References Cited

U.S. PATENT DOCUMENTS 5,171,700  12/1992  Zamanian ................................ 437/44
5,371,394  12/1994  Ma et al. ................................ 257/355

FOREIGN PATENT DOCUMENTS 57-36862  2/1982  Japan ................................ 257/345

OTHER PUBLICATIONS

C. Codella et al., "Submicron IGFET Device with Double Implanted Lightly Doped Drain/Source Structure," IBM Technical Disclosure Bulletin, vol. 26, No. 12, May 1984, pp. 6584–6586.

Primary Examiner—Steven H. Loke
Attorney, Agent, or Firm—Bruce T. Neel

[57] ABSTRACT

A low voltage field effect transistor structure (20) is provided with a threshold voltage that is tolerant of process variations that alter the location of a source implant region (41). A first halo region (33) and a second halo region (36) are formed adjacent to source region (41) such that after subsequent thermal processing, a constant doping profile of opposite conductivity as source region (41) is formed in the channel region (23) adjacent the source region (41). The embodiments can be formed either adjacent to only the source region (41) to create a unilateral device, or the doping profile can be formed adjacent to both source region (41) and a drain region (40) to produce a bilateral device. An additional embodiment forms a second implant region in source region (41) to reduce junction leakage and capacitance.

16 Claims, 4 Drawing Sheets

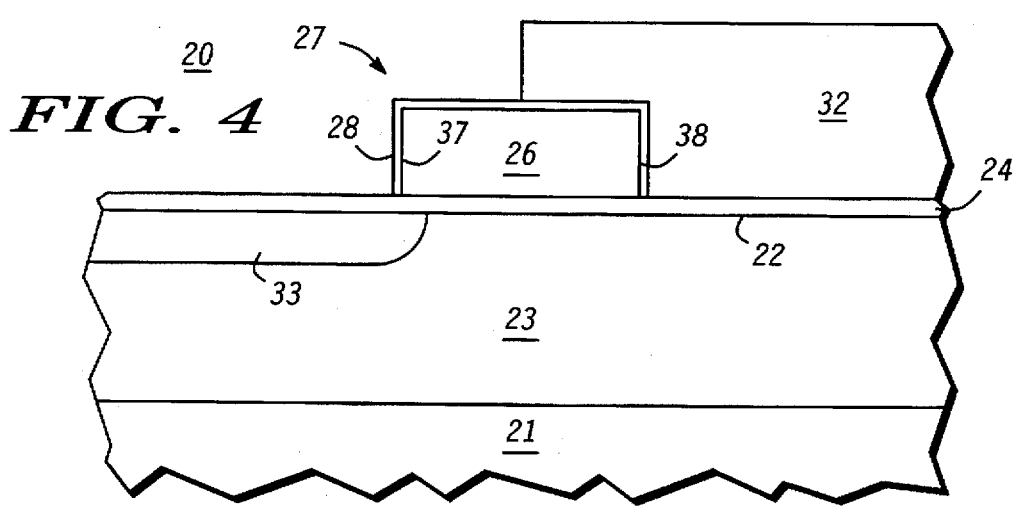
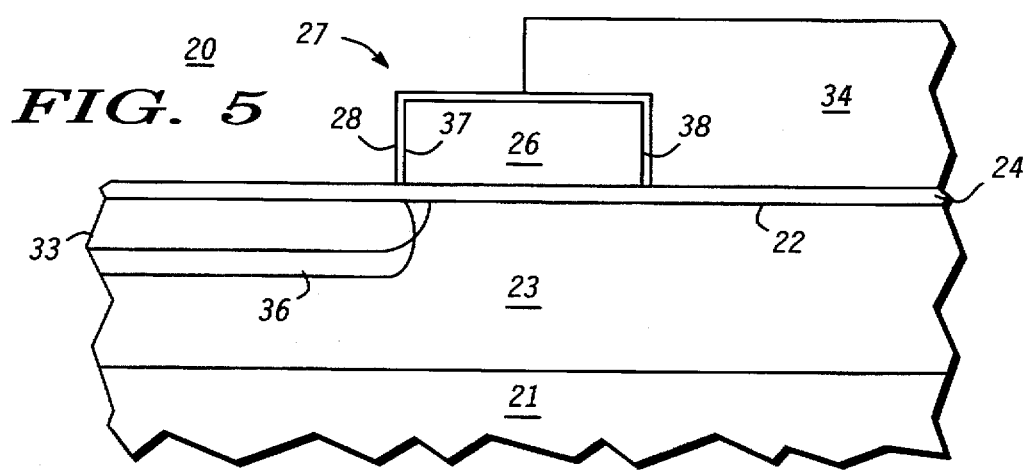
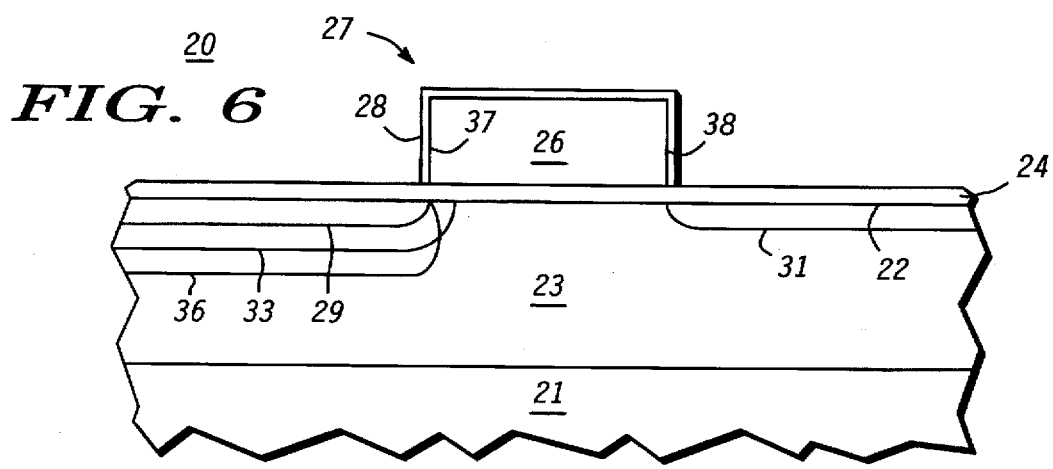

FET WITH STABLE THRESHOLD VOLTAGE AND METHOD OF MANUFACTURING THE SAME

BACKGROUND OF THE INVENTION

The present invention relates, in general, to field effect transistors, and more particularly to short channel length field effect transistors having low threshold voltages and enhanced punchthrough resistance.

Field effect transistor (FET) devices are becoming increasingly important in low voltage power applications including personal communication (e.g., pagers, cellular phones, etc.) and portable computers. With lower power consumption being a primary requirement with these applications, FET devices are being designed to operate at supply voltages less than 3.5 volts. However, semiconductor device parameters such as threshold voltage, subthreshold leakage currents, parasitic source/drain capacitances, and source to drain punchthrough typically limit the performance of low power semiconductor devices.

Source to drain punchthrough generally takes place with the merging of the source and drain depletion regions. When this occurs, the gate region is unable to control carriers in the channel region. The device basically becomes a short circuit and is considered uncontrollable. One previously known method to overcome this problem is to increase the uniform channel doping with a channel implant to inhibit punchthrough. This approach, however, is not desirable for low voltage and low power applications due to the loss in device performance. For effective low power applications the threshold voltage of the devices should be below 0.6 volts.

An alternative approach is to maintain a lower channel doping concentration and place highly doped regions in a bilateral fashion on both the source and drain sides. These regions are often termed halo or punchthrough stops. This approach inhibits punchthrough while maintaining lower threshold voltages (e.g., on the order of 0.3 volts). However, this approach suffers from higher capacitance and reduced drive capability (i.e., reduced transconductance), which in turn results in slower switching speeds.

As each device parameter is optimized for low power applications, there are two viewpoints that need to be considered when evaluating a low power device structure. The first perspective involves the physics of the device which determines the device performance and evaluates the interaction between all device parameters. For instance, there are several methods provided in the prior art that can be used to set the threshold voltage of semiconductor device. Each has its merits as a method to set threshold voltage, but the technique should also be judged based on the impact on all device parameters such as subthreshold leakage, punchthrough voltage, etc.

The second perspective that must be considered when evaluating a low power device structure determines the manufacturability of the proposed device. Again, any of the previously know methods to set threshold voltage are adequate to manufacture a limited number of devices in a research environment. These previously known methods, however, may not be effective when millions of devices must be manufactured in a high volume cost sensitive production facility. The method used to fabricate the low power/low voltage device must be tolerant of normal process variance in device parameters such as channel length, channel depth, or gate oxide thickness. The proposed method should be robust enough to withstand normal variations in these parameters and produce devices that operate over the required performance conditions.

Accordingly, it would be advantageous to have an FET device that possesses a low and controlled threshold voltage, that is punchthrough resistant, and that exhibits good switching characteristics. It would be of further advantage to provide such an FET device using conventional techniques to simplify its integration into existing structures.

BRIEF DESCRIPTION OF THE DRAWINGS

FIGS. 3–8 are enlarged cross-sectional views of an FET structure according to the present invention at various stages of fabrication;

DETAILED DESCRIPTION OF THE DRAWINGS

Figure 1:
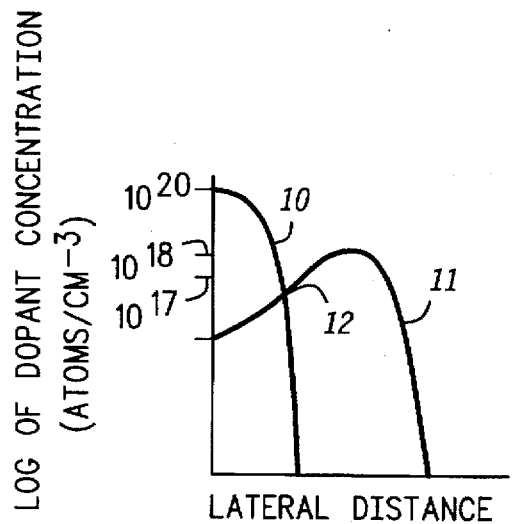
FIG. 1 is a graph showing the doping profile of previously known methods to set threshold voltage.

When designing a device structure and the corresponding fabrication process for low power applications, there are several issues that need to be considered. First there are the issues associated with the performance of the device and the interaction of each of the device parameters. For low power applications, there are several parameters which are critical such as threshold voltage, subthreshold leakage current, parasitic source/drain capacitance, and source to drain punchthrough voltage. Each one of these should be optimized for low voltage operation.

An even more important issue that must be considered when designing a low power transistor is its manufacturability. For example, there are many previously known methods for setting the threshold voltage of a FET. Each one of these may be effective for setting the threshold voltage of a few prototype devices, but not an effective technique in high volume production. To be manufacturable, the technique must be robust enough to tolerate the normal process variation that occurs. In low power transistors the more sensitive process parameters are gate oxide thickness, lateral and vertical diffusion of implant regions, gate poly thickness and doping, and channel length.

The present invention provides embodiments of a semiconductor device that is not only optimized for low power/low voltage applications, but is also optimized for high volume production. One of the more critical device parameters for low power transistors is the threshold voltage. With ever decreasing device geometry, the threshold voltage becomes dependent on the doping profile around the source/drain and channel region of the transistor. Slight variations in channel length or out-diffusion of implanted regions will dramatically affect the doping profile and therefore introduce variation in the threshold voltage. The present invention provides embodiments that will not only set the threshold voltage, but offer a stable threshold voltage over normal process variations.

The threshold voltage is determined as the voltage potential required at the gate terminal such that a conductive region of carriers is formed in the channel region which connects the source and drain regions. To set the threshold voltage to a predictable value, it is common in the art to uniformly implant the channel region with dopant of opposite conductivity as the source region. However, the presence of additional dopant atoms in the channel region will reduce the mobility of carriers in the channel which will reduce the performance of the transistor making it undesirable for low power/low voltage applications. If a uniform channel doping is not used to set the threshold voltage, then one of the critical elements of the channel region is the area where the source region ends and the channel region begins. The doping profile and concentration in this transition region can play a key role in determining the deviation in threshold voltage of a submicron device.

The present invention provides for a low power/low voltage transistor that is able to tolerate variations in the source implant region by forming a dopant profile of the opposite conductivity neighboring the source implant. This dopant profile is intended to have a constant doping concentration near the interface with the source region under the gate structure. Therefore any variation in the location of the edge of source region will still produce a device that has a predictable and constant transition from source doping to channel doping.

FIG. 1 is a graph showing the typical doping profile of previously known methods for setting threshold voltage and is provided to show the susceptibility to process variations. The y-axis is a logarithmic plot of the doping profile in terms of the number of dopant atoms per cubic centimeter. The x-axis is the lateral distance beginning with the gate edge (near the source) at the origin of the x-axis and extending into the channel region to the right. By plotting the concentration of source region 10, which extends into channel region towards the right, and threshold setting region 11 we can predict the impact variations in source region 10 may have on the threshold voltage. Intersection 12 of source region 10 and threshold setting region 11 again is critical in determining the manufacturability of a low power device. With normal process variations source region 10 may extend further into the channel region. The result of this variation is that intersection 12 between source region 10 and threshold setting region 11 will occur further to the right on FIG. 1. Therefore the doping concentration at the transition of these two regions will be higher. The variation in the intersection 12 of these two regions is what causes the standard deviation in the threshold voltage of the device to be high.

In the present invention a constant doping profile is formed such that any variation in the location of the source region will result in a transition region with the same concentration profile. This constant doping profile is accomplished by a plurality of implant regions formed near the source region. After subsequent thermal processing, the dopant from the plurality of implant regions will overlap to form a doping profile that is essentially constant at the edge of the source in the channel region i.e. intersection 12.

Figure 2:
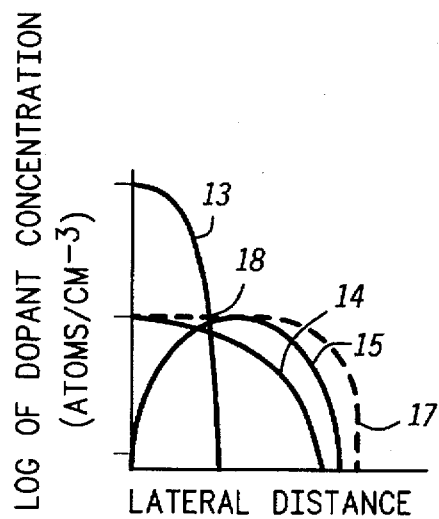
FIG. 2 is a graph showing the doping profile of a device employing one of the embodiments of the present invention.

FIG. 2 is a graph showing the doping profile of a transistor employing an embodiment of the present invention. In this example, two halo implants with conductivity opposite of the source are used to form the constant lateral dopant profile. A source implant concentration 13 is plotted with a first halo implant concentration 15 and a seconds halo implant concentration 14. After subsequent thermal processing, first halo implant concentration 15 and second halo implant concentration 14 form a flat doping profile 17 at transistion point 18 near the source region. The intersection 18 of source implant concentration 13 and flat doping profile 17 allow source implant 13 to vary in concentration or in lateral position and still provide for a transition concentration 18 that is constant and predictable.

A method for fabricating the present invention will now be provided in an p-channel configuration. This is not intended as a limitation and as those skilled in art will appreciate, a n-channel configuration is achieved by converting p-type regions to n-type regions and vice versa. Previously this invention discussed forming a constant doping profile near the source region. This is commonly referred to as a unilateral device. It should also be appreciated that a constant doping profile can also be formed in the channel region near the drain region. A second doping profile at the drain-channel interface would improve the punchthrough resistance of the device, but would increase the doping concentration in the channel which will reduce the mobility of carriers and switching speed of the device. A device that has doping profiles around both the source and drain regions is referred to as a bilateral device. Such devices are offered as an additional embodiment of the present invention.

Figure 3:
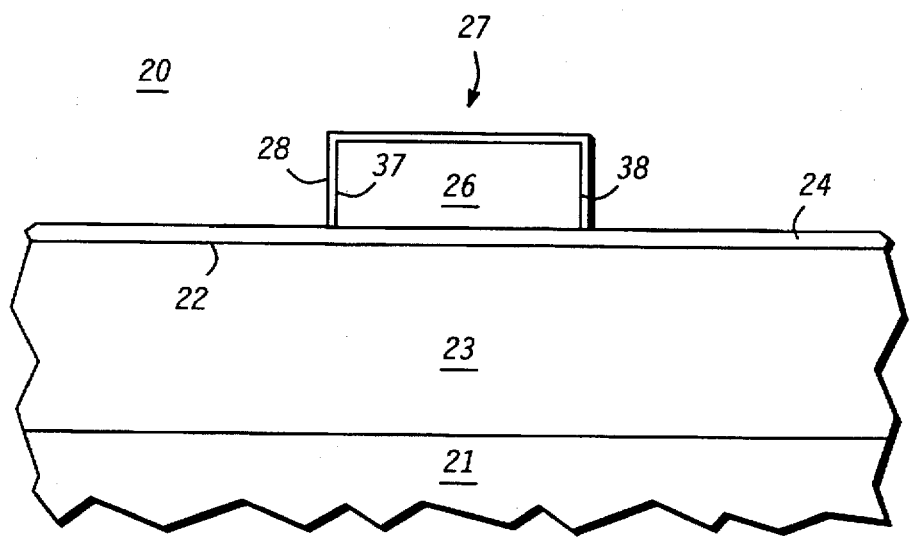

FIG. 3 illustrates an enlarged cross-sectional view of a portion of partially completed FET structure 20 according to the present invention. Structure 20 includes a body of semiconductor material or substrate region 21 of a first conductivity and having a major surface 22. An impurity well 23 of n-type conductivity extends into semiconductor substrate 21 from major surface 22. Methods for forming impurity well 23 are well known in the art. By way of example, substrate 21 is a p-type substrate with a resistivity in a range from about 6 ohm-cm to about 22 ohm-cm. Impurity well 23 has a surface dopant concentration typically on the order of $2.0 \times 10^{16}$ atoms/cm$^3$ and extends into substrate 21 to a depth of about 2 to 3 microns.

A gate dielectric layer 24 is formed on major surface 22. Preferably, gate dielectric layer 24 comprises silicon oxide with a thickness in the range from approximately 50 angstroms to approximately 250 angstroms. A gate layer 26 is formed on a portion of gate dielectric layer 24. Gate layer 26 typically comprises a polycrystalline semiconductor layer such as a polysilicon layer and by way of example, gate layer 26 has a thickness of about 3,000 angstroms. Gate layer 26 together with that portion of gate dielectric layer 24 between major surface 22 and gate electrode 26 form a gate structure 27. Gate structure 27 has a first edge 37 which represents the source side of the device and a second edge 38 which represents the drain side of the device. Gate structure 27 is formed to provide a device with channel lengths of about 0.25 microns to about 30 microns. Oxide layer 28 is formed on gate structure 27 during subsequent thermal processing.

FIG. 4 illustrates an enlarged cross-sectional view of a portion of partially completed FET structure 20 after further processing. A source-side extension region, doped region, halo region, punchthrough stop, or unilateral extension region 33 is formed on the source side of device 20. FIG. 4 shows structure 20 with a first masking layer 32 formed over major surface 22 and a portion of gate structure 27 such that the source region is exposed. First masking layer 32 is for example, a thick (e.g., 1.0 micron) photoresist layer, a dielectric layer, or the like. After masking layer 32 is formed, the n-type halo region 33 is formed by ion implanting an n-type dopant such as arsenic or phosphorus into major surface 22 preferably at an angle of zero degrees (i.e., substrate 21 is perpendicular to the ion beam). A phosphorus dose of about $5.0 \times 10^{12}$ atoms/cm$^2$ to $1.0 \times 10^{14}$ atoms/cm$^2$ and an implant energy of about 30 keV to 90 keV is suitable to provide n-type implant region 33 with a peak concentration of $1.0 \times 10^{17}$ atoms/cm$^3$ to $1.0 \times 10^{18}$ atoms/cm$^3$. Masking layer 32 can then be removed prior to exposing the low voltage unilateral field effect transistor 20 to an elevated temperature to drive the dopant into the channel region. For example, substrate 21 is heated to about 950° C. to about 1100° C. for about 15 minutes to about 60 minutes.

FIG. 5 illustrates the low power field effect transistor 20 at a later step in fabrication. In particular, FIG. 5 shows structure 20 with a second masking layer 34 formed over major surface 22 and a portion of gate structure 27 such that source side 37 is exposed. Masking layer 34 is for example, a thick (e.g., 1.0 micron) photoresist layer, a dielectric layer, or the like. After masking layer 34 is formed, second halo region 36 is formed below first halo region 33. Second implant region 36 is formed by ion implanting with a n-type dopant such as arsenic or phosphorus into major surface 22 preferably at an angle of zero degrees (i.e., substrate 21 is perpendicular to the ion beam). A phosphorus dose of about $5.0 \times 10^{12}$ atoms/cm$^2$ to $1.0 \times 10^{14}$ atoms/cm$^2$ and an implant energy of about 30 keV to 150 keV is suitable to provide n-type implant region 36 with a peak concentration of $1.0 \times 10^{17}$ atoms/cm$^3$ to $1.0 \times 10^{18}$ atoms/cm$^3$. A second anneal step can be performed to achieve the desired doping profile depth and to activate the implanted dopant.

FIG. 6 illustrates an enlarged cross-sectional view of a portion of partially completed FET structure 20 after further processing. A source region 29 and a drain region 31 of a second conductivity type are formed adjacent to gate structure 27. Source region 29 and drain region 31 are formed by ion implanting with an p-type dopant such as boron or $BF_2$ into major surface 22 preferably at an angle of zero degrees (i.e., substrate 21 is perpendicular to the ion beam). An implant dose of about $1.0 \times 10^{13}$ atoms/cm$^2$ to about $5.0 \times 10^{15}$ atoms/cm$^2$ and an implant energy less than about 50 keV is suitable. Optionally, the process steps depicted in FIGS. 4, 5 and 6 may occur in other sequences to that shown.

Figure 7:
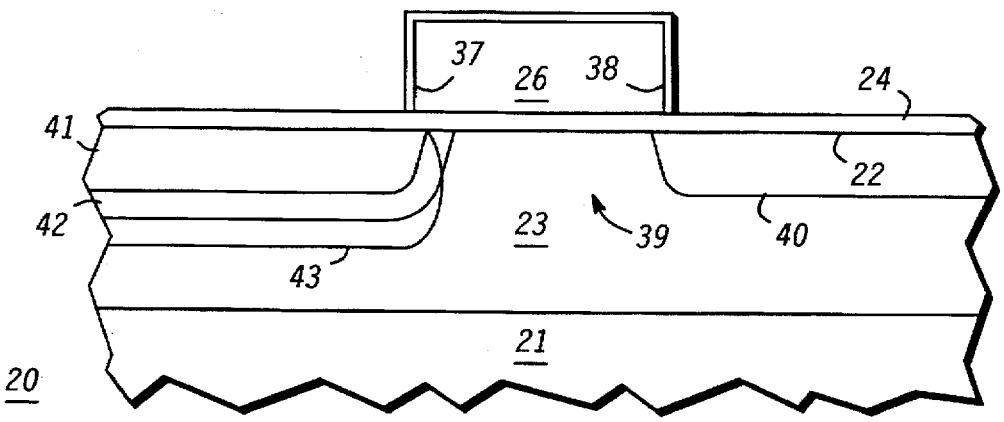

FIG. 7 illustrates an enlarged cross-sectional view of a portion of partially completed FET structure 20 after further processing. The FET structure 20 is then exposed to an elevated temperature in a rapid thermal anneal (RTA) system. For example, substrate 21 is heated to about 1000° C. to about 1100° C. for about 15 seconds to about 60 seconds. The cumulative thermal processing will drive the source region 29, drain region 31, first halo region 33, and second halo region 36 of FIG. 6 into substrate 21 and activate the dopant that was implanted. FIG. 7 shows the relative location of these implanted regions after this thermal processing. Source region 29 and drain region 31 of FIG. 6 will become source region 41 and drain region 40 respectively in FIG. 7 and have a first lateral distance into the channel region 39 and a first vertical distance below the major surface. First halo region 33 of FIG. 6 will become first halo region 42 in FIG. 7 and will have a second lateral distance into the channel region 39 and a second vertical distance below the major surface. Second halo region 36 of FIG. 6 will become second halo region 43 in FIG. 7 and will have a third lateral distance into the channel region 39 and a third vertical distance below the major surface.

Source region 41 and drain region 40 typically extend into impurity well 23 to a junction depth of about 0.2 microns to about 0.3 microns and have a surface dopant concentration of about $1.0 \times 10^{20}$ atoms/cm$^3$. First implant region 42 typically has a first peak concentration from about $1.0 \times 10^{17}$ atoms/cm$^3$ to about $1.0 \times 10^{18}$ atoms/cm$^3$ and extends into the channel region 0.05 µm to 0.25 µm under gate structure 27 (i.e. from first edge 37 of gate structure 27), and has a depth below major surface 22 of about 0.3 microns to 0.6 microns. Second implant region 43 typically has a second peak concentration from about $1.0 \times 10^{17}$ atoms/cm$^3$ to about $1.0 \times 10^{18}$ atoms/cm$^3$ and extends into the channel region 0.05 µm to 0.20 µm under gate structure 27 (i.e. from first edge 37 of gate structure 27), and has a depth below major surface 22 of about 0.3 microns to 0.6 microns. Using the above mentioned process, first implant region 42 will extend further into channel region 39 at the surface 22 than second implant region 43. Since second implant region 43 has a peak concentration that is further below surface 22 than first implant region 42 the two implant regions will overlap and form a flat doping profile near source region 41. The doping profile may extend into channel region 39 a first lateral distance of 0.05 µm to 0.25 µm from first edge 37 of gate structure 27.

Figure 8:
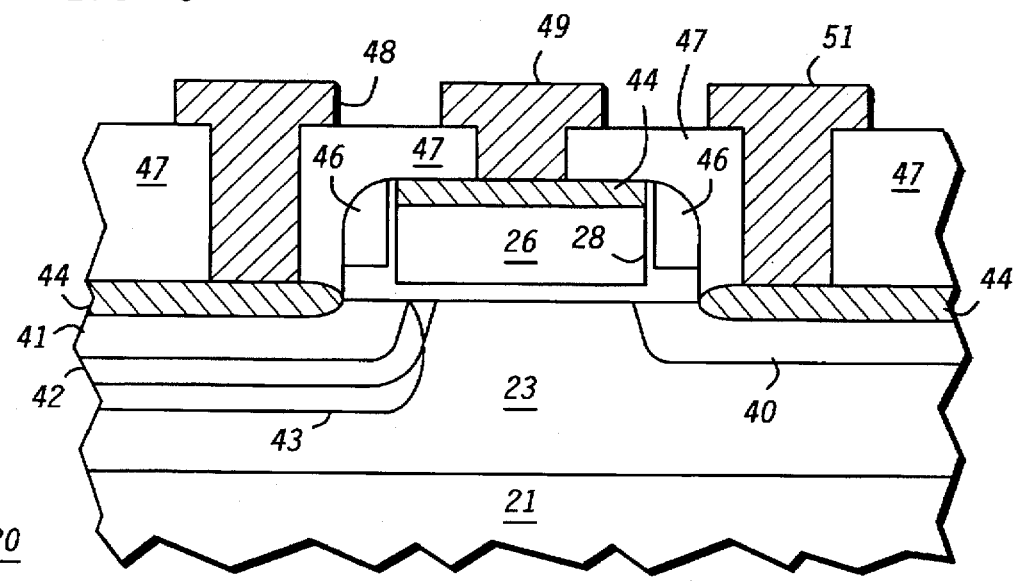

FIG. 8 illustrates structure 20 towards the end of fabrication. Using techniques well known in the art, dielectric spacers 46 are formed along oxide layer 28 lining the sidewalls of gate layer 26. Spacers 46 comprise, for example, silicon nitride or the like. Electrodes are formed that provide contact to source region 41, drain region 40 and gate layer 26. For example, a silicide 44 is formed in source region 41, drain region 40, and gate layer 26 using well known techniques. It is also possible to form dielectric spacers 46 prior to the anneal step shown in FIG. 7.

An insulating layer 47 is formed on structure 20, i.e., on source region 41, drain region 40 and gate layer 26. A plurality of openings (not shown) are then formed in insulating layer 47 to expose portions of silicide 44 in source region 41, drain region 40, and gate layer 26. Source and drain electrodes 48 and 51 and gate electrode 49 are formed using well known techniques to contact silicide 44 in source region 41 and drain region 40 and on gate layer 26 respectively.

Figure 9:
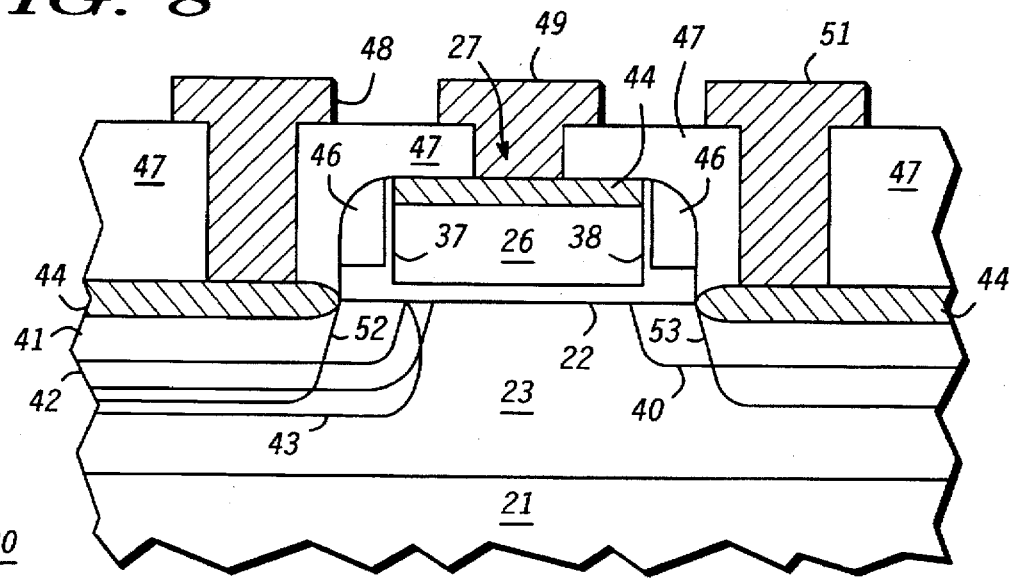
FIG. 9 is an enlarged cross-sectional view of a second embodiment of an FET structure according to the present invention.

FIG. 9 illustrates an enlarged cross-sectional view of a second embodiment of an FET structure according to the present invention. Structure 20 includes a second source region 52 and a second drain region 53 formed by ion implanting with a p-type dopant such as boron or $BF_2$ into major surface 22 preferably at an angle of zero degrees (i.e., substrate 21 is perpendicular to the ion beam). An implant dose of about $1.0 \times 10^{14}$ atoms/cm$^2$ to about $5.0 \times 10^{15}$ atoms/cm$^2$ and an implant energy less than about 60 keV is suitable to form the third doped region. Second source region 52 and drain region 53 typically extend into impurity well 23 to a junction depth of about 0.2 microns to about 0.4 microns and have a surface concentration of about $1.0 \times 10^{20}$ atoms/cm$^3$. The additional source region 52 and drain region 53 shown in FIG. 9 will reduce the source/drain capacitance of FET 20.

Figure 10:
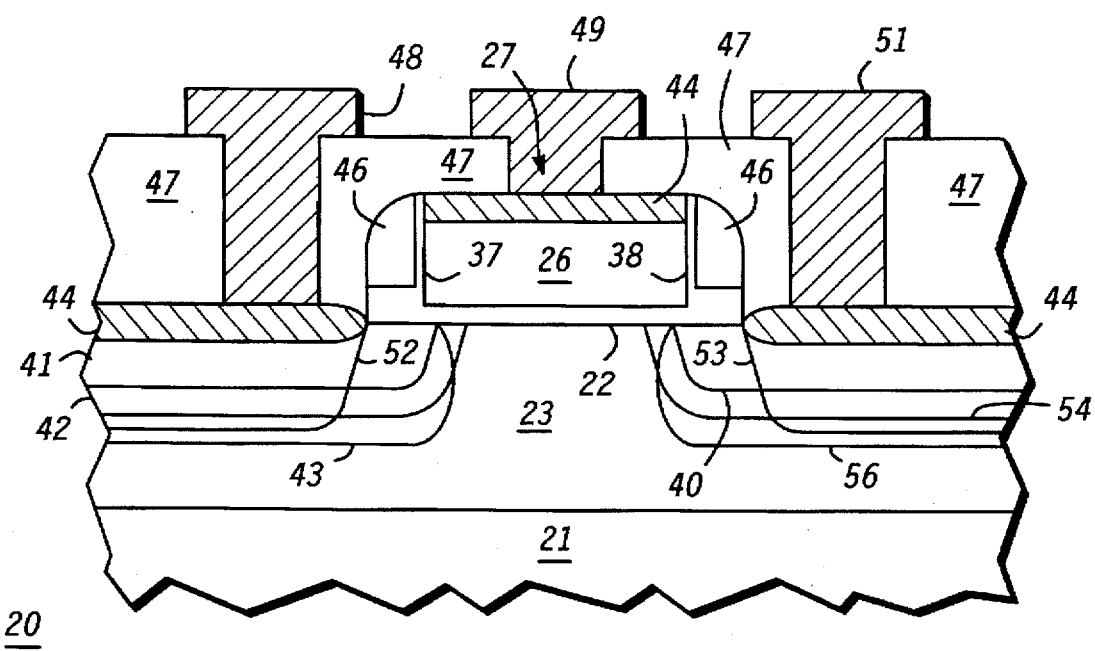
FIG. 10 is an enlarged cross-sectional view of a third embodiment of a FET structure according to the present invention.

FIG. 10 illustrates an enlarged cross-sectional view of a third embodiment of an FET structure according to the present invention. In the previous discussion, a unilateral device was formed by limiting the formation of halo regions 42 and 43 around the source region 52 only. It should be appreciated by those skilled in the art that it is possible to form halo regions 54 and 56 around drain region 53 as well to produce a bilateral device as shown in FIG. 10. Halo regions 54 and 56 are typically formed during the same process steps to form halo regions 42 and 43 respectively and have similar doping profiles and concentrations.

By now it should be appreciated that the present invention provides a FET structure and methods for fabricating with an improved tolerance to normal process variations encountered in a production environment. The doping concentration at the transition region between the source and channel regions is critical to controlling the threshold voltage. By forming a constant doping profile in the channel region adjacent to the source region, the device can tolerate shifts in the source implant region yet still have essentially the same threshold voltage. The present invention also provides embodiments for forming a second source and drain implant to further reduce the junction leakage and junction capacitance.

We claim:

1. A field effect transistor having stable threshold voltage comprising:

a substrate region of a semiconductor material of a first conductivity type and having a surface;

a source region of a second conductivity type formed in the substrate region and adjacent to a channel region;

a first implant region disposed in the substrate region such that first implant region is contiguous with the source region at the surface and extends into the channel region below the surface of the substrate region, the first implant region having a first concentration of the first conductivity type; and a second implant region disposed between the source region and the first implant region extending beyond the first implant region at the surface and into the channel region, wherein the first implant region and the second implant region form a first dopant profile region of constant doping at an intersection with the source region and in a portion of the substrate region adjacent to the source region, the second implant region having a second concentrating of the first conductivity type.

2. The field effect transistor having stable threshold voltage of claim 1 wherein the first concentration is approximately $1 \times 10^{17}$ atoms per $cm^3$ to $1 \times 10^{18}$ atoms per $cm^3$.

3. The field effect transistor having stable threshold voltage of claim 1 wherein the second concentration is approximately $1 \times 10^{17}$ atoms per $cm^3$ to $1 \times 10^{18}$ atoms per $cm^3$.

4. The field effect transistor having stable threshold voltage of claim 1 further comprising a third implant region disposed between the source region and the first implant region, the third implant region is of the second conductivity type.

5. The field effect transistor having stable threshold voltage of claim 4 wherein the third implant region has a surface concentration of approximately $1 \times 10^{20}$ atoms per cm.

6. The field effect transistor having stable threshold voltage of claim 1 further comprising:

a drain region of the second conductivity type formed in the substrate region;

a third implant region disposed below the drain region and extending into a channel side of the drain region, the third implant region having a third concentration of the first conductivity type; and a fourth implant region disposed between the drain region and the third implant region and extending into the channel side of the drain region, wherein the third and fourth implant regions form a second dopant profile region of constant doping at an intersection with the drain region a portion of the channel region adjacent to the drain region, the fourth implant region having a fourth concentration of the first conductivity type.

7. The field effect transistor having stable threshold voltage of claim 6 wherein the third concentration is approximately $1 \times 10^{17}$ atoms per $cm^3$ to $1 \times 10^{18}$ atoms per $cm^3$.

8. The field effect transistor having stable threshold voltage of claim 6 wherein the fourth concentration is approximately $1 \times 10^{17}$ to $1 \times 10^{18}$ atoms per $cm^3$.

9. The field effect transistor having stable threshold voltage of claim 6 further having a fifth implant region disposed between the drain region and the third implant region, the fifth implant region is of the second conductivity type.

10. The field effect transistor having stable threshold voltage of claim 9 wherein the fifth implant region has a surface concentration of approximately $1 \times 10^{20}$ atoms per $cm^3$.

11. A low voltage unilateral field effect transistor having a robust threshold voltage and punchthrough resistance provided by a plurality of halo regions comprising:

a body of a semiconductor material of a first conductivity type and having a first major surface;

a gate structure formed on the first major surface, the gate structure having a first edge and a second edge;

a source region of a second conductivity type formed in the body of the semiconductor material contiguous with the first edge of the gate structure and extending from the first major surface;

a drain region of said second conductivity type formed in the body of the semiconductor material contiguous with the second edge of the gate structure and extending from the first major surface wherein a portion of the body of semiconductor material separates the source region from the drain region to provide a channel region;

a plurality of halo regions of the first conductivity type aligned to the first edge of the gate structure and formed in the body of the semiconductor material such that the plurality of halo regions form a dopant profile that is essentially constant where the dopant profile contacts and is adjacent to the source region;

a first electrode coupled to the source region;

a second electrode coupled to the drain region; and a third electrode coupled to the gate structure.

12. The low voltage unilateral field effect transistor of claim 11 wherein the plurality of halo regions comprises a first halo region with a first peak concentration that extends into the channel region 0.05 µm to 0.25 µm from the first edge of the gate structure.

13. The low voltage unilateral field effect transistor of claim 12 wherein the plurality of halo regions comprises a second halo region with a second peak concentration that extends into the channel region 0.05 µm to 0.2 µm from the first edge of the gate structure.

14. The low voltage unilateral field effect transistor of claim 11 wherein the gate structure includes a polycrystalline semiconductor layer formed on a gate dielectric layer.

15. The low voltage unilateral field effect transistor of claim 11 further comprising a first implant region of the second conductivity type formed in the source region.

16. The low voltage unilateral field effect transistor of claim 11 wherein the dopant profile has an edge, and the edge of the dopant profile extends into the channel region from a first edge of the gate structure a first lateral distance of 0.05 µm to 0.25 µm.

* * * * *